(12) United States Patent
Kil et al.

(10) Patent No.: US 7,259,059 B2
(45) Date of Patent: Aug. 21, 2007

(54) METHOD FOR FORMING CAPACITOR OF SEMICONDUCTOR DEVICE

(75) Inventors: Deok Sin Kil, Kyoungki-do (KR); Ki Seon Park, Kyoungki-do (KR); Jae Sung Roh, Kyoungki-do (KR); Hyun Chul Sohn, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 133 days.

(21) Appl. No.: 11/122,597

(22) Filed: May 5, 2005

(65) Prior Publication Data

US 2006/0094199 A1    May 4, 2006

(30) Foreign Application Priority Data

Oct. 29, 2004   (KR) ...................... 10-2004-0086984

(51) Int. Cl.
*H01L 21/8242*   (2006.01)
(52) U.S. Cl. .................. 438/240; 438/239; 438/386; 438/393; 438/396; 438/785
(58) Field of Classification Search .................. None
See application file for complete search history.

(56) References Cited

U.S. PATENT DOCUMENTS

| | | | |
|---|---|---|---|
| 6,753,618 B2 * | 6/2004 | Basceri et al. .............. | 257/296 |
| 7,115,942 B2 * | 10/2006 | Wang .......................... | 257/321 |
| 2004/0238872 A1 * | 12/2004 | Lee et al. .................... | 257/306 |
| 2004/0266217 A1 * | 12/2004 | Kim et al. ................... | 438/778 |
| 2005/0260347 A1 * | 11/2005 | Narwankar et al. ....... | 427/248.1 |
| 2005/0260357 A1 * | 11/2005 | Olsen et al. ................ | 427/569 |
| 2006/0006454 A1 * | 1/2006 | Wang .......................... | 257/314 |

FOREIGN PATENT DOCUMENTS

KR    10-20040060309    7/2004

* cited by examiner

*Primary Examiner*—Mary Wilczewski
*Assistant Examiner*—Khanh Duong
(74) *Attorney, Agent, or Firm*—Ladas & Parry LLP

(57) ABSTRACT

Disclosed is a method for forming a capacitor of a semiconductor device, which can improve a leakage current characteristic in applying $Hf_xAl_yO_z$ as a dielectric film. In such a method, $Hf_xAl_yO_z$ thin films are deposited on a storage electrode to form an $Hf_xAl_yO_z$ dielectric film and a plate electrode is formed on the dielectric film. The $Hf_xAl_yO_z$ dielectric film consists of laminated $Hf_xAl_yO_z$ thin films which are different in compositions of Hf and Al such that the lower $Hf_xAl_yO_z$ thin film adjoining the storage electrode has a larger composition ratio of Al than that of Hf and the upper $Hf_xAl_yO_z$ thin film has a larger composition ratio of Hf than that of Al, and the upper $Hf_xAl_yO_z$ thin film is subjected to heat treatment under an oxygen atmosphere after its deposition.

10 Claims, 2 Drawing Sheets

METHOD FOR FORMING CAPACITOR OF SEMICONDUCTOR DEVICE

BACKGROUND OF THE INVENTION

1. Field of the Invention

The present invention relates generally to a method for forming a capacitor of a semiconductor device, and more particularly to a method for forming a capacitor of a semiconductor device, in which an excellent leakage current characteristic as well as desired charging capacity can be ensured.

2. Description of the Prior Art

Recently, cells of a DRAM device has occupied a smaller area with increase in a degree of integration of the DRAM device, so it becomes more and more difficult to ensure charging capacity required. As is well known in the art, the charging capacity of a capacitor is proportional to an area of an electrode and a dielectric constant of a dielectric film, and is inversely proportional to a distance between electrodes, that is, a thickness of the dielectric film. For ensuring charging capacity required, therefore, it is necessary to reduce the thickness of the dielectric film or to apply materials having a large dielectric constant as the dielectric film.

Thereupon, in order to ensure charging capacity required, researches are being vigorously pursued to replace the existing Oxide-Nitride-Oxide (ONO) dielectric film by a single dielectric film of Al2O3 ($\epsilon$=9), a single dielectric film of HfO2 ($\epsilon$=25) or a dual dielectric film of HfO2/Al2O3 in which Al2O3 and HfO2 are simply laminated.

In terms of an unit process cost, it may be profitable to employ the single dielectric film of Al2O3 or Hfo2, but Al2O3 has a restriction on ensuring charging capacity because its dielectric constant is not so different from that of the existing Si3N4 material ($\epsilon$=7), and HfO2 is thermally unstable and thus has a poor leakage current characteristic due to its low crystallization temperature although it has a large dielectric constant. As a result of this, it is practically difficult to solely apply Al2O3 or HfO2 as a dielectric film.

In order to solve the problem related to HfO2, a laminated structure of HfO2/Al2O3, in which Al2O3 and HfO2 are simply laminated, has been introduced. However, the simple laminated structure of HfO2/Al2O3 causes loss in charging capacity due to a low dielectric constant of Al2O3 and has a poor thermal stability at a high temperature because HfO2 is still easy to be crystallized. That is, the laminated structure of HfO2/Al2O3 has a problem in that its leakage current characteristic is deteriorated at a high temperature.

In addition, an HfxAlyOz thin film consisting of a solid solution of Hf and Al has been proposed recently. However, when the HfxAlyOz thin film is deposited at a temperature of 300° C. or less by an Atomic Layer Deposition (hereinafter referred to as 'ALD') technique using Tri-Methyl-Aluminum (Al(CH3)3; TMA) as a source of Al and Tetrakis (ethylmethylamino)hafnium (Hf[N(CH3)C2H5]4; TEMAH), impurities existing within the film, such as C and H, incur a technical problem of deterioration in a leakage current characteristic. Of course, an attempt may be made to improve electrical characteristics by subsequently performing heat treatment under a high reactive oxygen atmosphere after the formation of the HfxAlyOz dielectric film. In spite of such an attempt, however, it has been reported that an oxidation reaction is generated at an interface between the HfxAlyOz dielectric film and a storage electrode to cause deterioration in electrical characteristics.

SUMMARY OF THE INVENTION

Accordingly, the present invention has been made to solve the above-mentioned problems occurring in the prior art, and an object of the present invention is to provide a method for forming a capacitor of a semiconductor device, in which an HfxAlyOz thin film is applied as a dielectric film of the capacitor while its leakage current characteristic can be improved.

A further object of the present invention is to provide a method for forming a capacitor of a semiconductor device, in which not only desired charging capacity can be secured, but also an excellent leakage current characteristic can be ensured.

In order to accomplish these objects, there is provided a method for forming a capacitor of semiconductor device in accordance with one aspect of the present invention, the method comprising the steps of: forming a storage electrode; depositing HfxAlyOz thin films on the storage electrode to form an HfxAlyOz dielectric film; and forming a plate electrode on the HfxAlyOz dielectric film, wherein the HfxAlyOz dielectric film consists of laminated HfxAlyOz thin films which are different in compositions of Hf and Al such that the lower HfxAlyOz thin film adjoining the storage electrode has a larger composition ratio of Al than that of Hf and the upper HfxAlyOz thin film has a larger composition ratio of Hf than that of Al, and the upper HfxAlyOz thin film is subjected to heat treatment under an oxygen atmosphere after its deposition.

Here, the HfxAlyOz dielectric film consists of a first HfxAlyOz thin film and a second HfxAlyOz thin film laminated on the first HfxAlyOz thin film, and the first and second HfxAlyOz thin films are different in compositions of Hf and Al from each other such that a ratio of Hf:Al in the first HfxAlyOz thin film is 1:2 and a ratio of Hf:Al in the second HfxAlyOz thin film is 2:1.

Preferably, the heat treatment under an oxygen atmosphere is performed using O3 or O2 plasma treatment.

In accordance with another aspect of the present invention, the above-mentioned objects are achieved by providing a method for forming a capacitor of a semiconductor device, the method comprising the steps of: forming a storage electrode on a semiconductor substrate; depositing a first HfxAlyOz thin film, which has a larger composition ratio of Al than that of Hf, and a second HfxAlyOz thin film, which has a larger composition ratio of Hf than that of Al, on the storage electrode to form a dielectric film having a dual HfxAlyOz structure; performing heat treatment of the second HfxAlyOz thin film under an oxygen atmosphere so as to improve a leakage current characteristic of the second HfxAlyOz thin film; and forming a plate electrode on the dielectric film having a dual HfxAlyOz structure, which includes the second HfxAlyOz thin film subjected to heat treatment under an oxygen atmosphere.

Here, the storage electrode and the plate electrode consist of doped polysilicon or TiN.

Preferably, the dielectric film having a dual HfxAlyOz structure is formed by repeatedly performing a first deposition cycle, in which Hf source gas flowing, N2 purging, O3 oxidation gas flowing and N2 purging progress successively, and a second deposition cycle, in which Al source gas flowing, N2 purging, O3 oxidation gas flowing and N2 purging progress successively, the number of times desired for each cycle to deposit a first HfxAlyOz thin film and a second HfxAlyOz thin film having different compositions of Hf and Al, provided that the number of times of the first cycle is smaller than that of the second cycle during the deposition of the first HfxAlyOz thin film so as to provide a larger composition ratio of Al than that of Hf, preferably a ratio of Hf:Al of 1:2 within the first HfxAlyOz thin film, and the number of times of the first cycle is larger than that of the second cycle during the deposition of the second HfxAlyOz thin film so as to provide a larger composition ratio of Hf than that of Al, preferably a ratio of Hf:Al of 2:1 within the second HfxAlyOz thin film.

It is preferred that the heat treatment under an oxygen atmosphere is performed using O3 or O2 plasma treatment.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
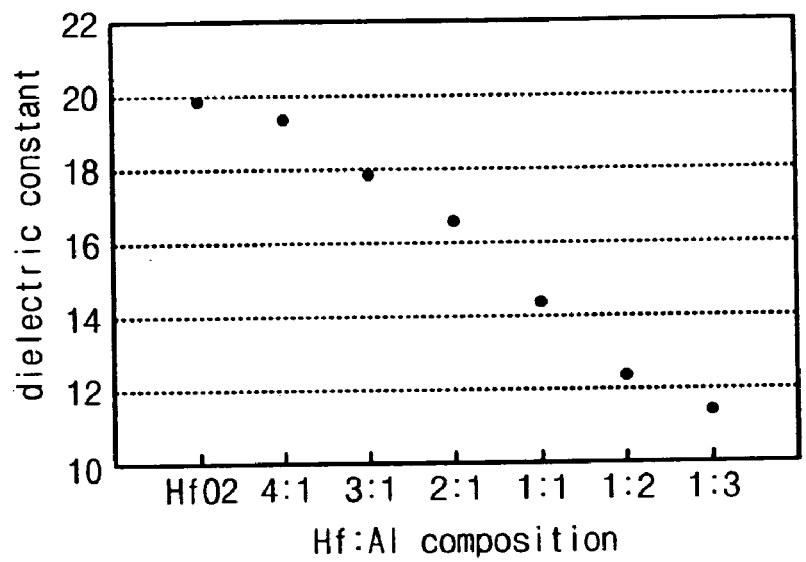
FIG. 1 is a graphic diagram showing a change in a dielectric constant according to composition ratios of HfO2 and Al2O3.

Hereinafter, preferred embodiments of the present invention will be described with reference to the accompanying drawings. In the following description and drawings, the same reference numerals are used to designate the same or similar components, and so repetition of the description on the same or similar components will be omitted.

In a method for forming a capacitor of a semiconductor device according to the present invention, a dielectric film consists of laminated HfxAlyOz thin films which are different in compositions of Hf and Al. To be concrete, HfxAlyOz thin films constituting the dielectric film are laminated such that a lower HfxAlyOz thin film adjoining an interface between the dielectric film and a storage electrode has a large composition of Al and an upper HfxAlyOz thin film has a large composition of Hf.

Figure 2:
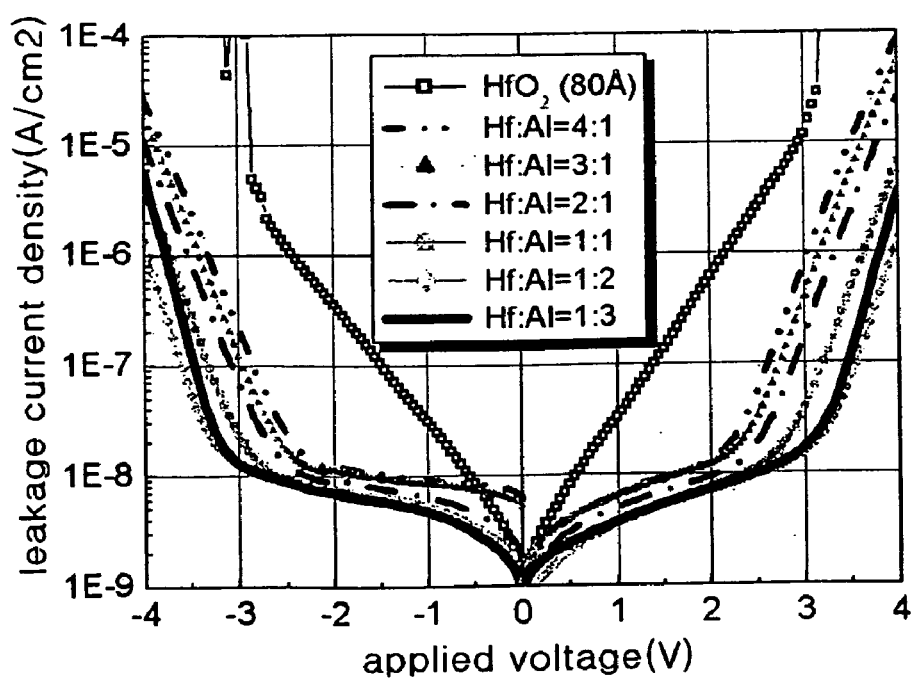
FIG. 2 is a graphic diagram showing a change in a leakage current according to composition ratios of HfO2 and Al2O3.

As seen from FIGS. 1 and 2, with increase in composition of Al, a dielectric constant of the HfxAlyOz thin film decreases, but its leakage current characteristic is improved because an energy band gap (Eg) increases.

Based upon this, the present invention applies an HfxAlyOz thin film as a dielectric film while an HfxAlyOz thin film having a large composition of Al is disposed at an interface between the dielectric film and a storage electrode, and an HfxAlyOz thin film having a large composition of Hf is disposed in an upper portion, thus ensuring charging capacity required by utilizing the large dielectric constant of Hf to the maximum extent possible and simultaneously improving a leakage current characteristic by utilizing a characteristic of Al, that is, a characteristic increasing the band gap.

Figure 3:
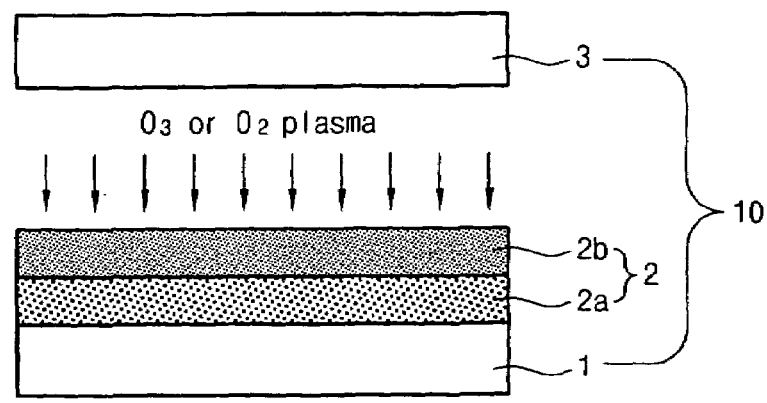
FIG. 3 is a schematic view of a capacitor to which a dielectric film having a dual HfxAlyOz structure according to the present invention is applied.
Figure 4:
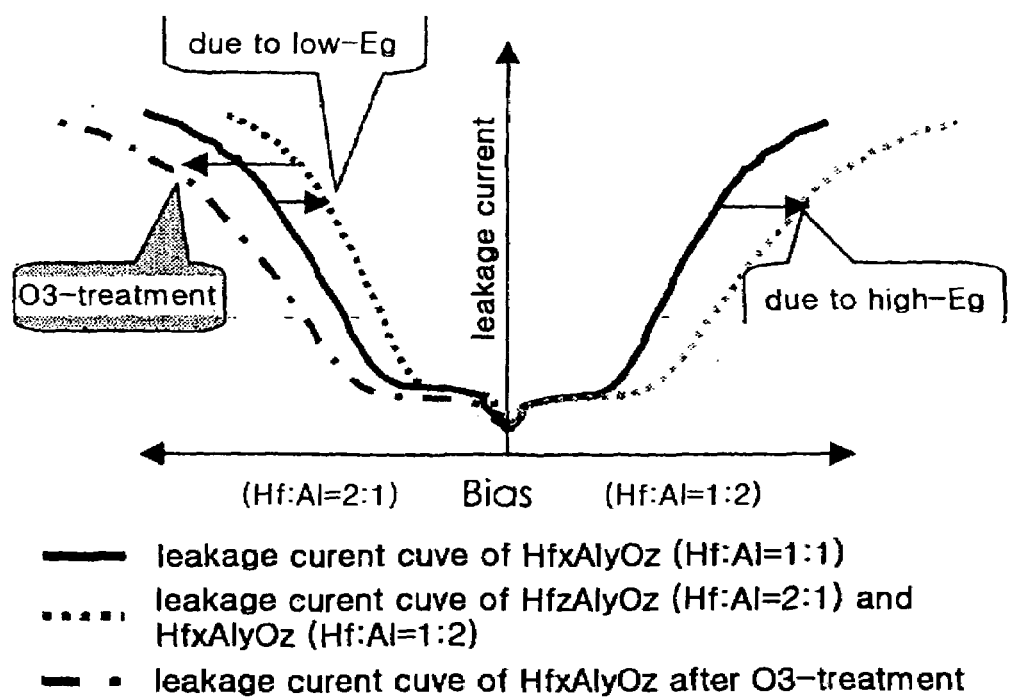
FIG. 4 is a graphic diagram showing a leakage current characteristic of a capacitor according to the present invention.

FIG. 3 illustrates a schematic view of a capacitor to which a dielectric film having a dual HfxAlyOz structure according to the present invention is applied, and FIG. 4 illustrates a graphic diagram showing a leakage current characteristic of the capacitor according to the present invention, for which a description will be given below in detail.

Referring to FIG. 3, a conductive thin film is deposited on a semiconductor substrate (not shown) to form a storage electrode 1. For example, the conductive thin film consists of polysilicon doped with As, P or the like for imparting conductivity thereto or TiN. Thereafter, a first HfxAlyOz thin film 2a and a second HfxAlyOz thin film 2b are successively deposited on the storage electrode 1 to a dielectric film 2 having a dual HfxAlyOz structure. Finally, similarly to the storage electrode 1, a plate electrode 3 is formed by depositing a conductive thin film such as polysilicon doped with As, P or the like for imparting conductivity thereto or TiN on the dual HfxAlyOz dielectric film. In this way, the capacitor 10 of the present invention is completed.

In forming the dielectric film 2, the first and second HfxAlyOz thin films 2a, 2b are deposited by repeatedly performing a first deposition cycle m, in which Hf source gas flowing, N2 purging, O3 oxidation gas flowing and N2 purging progress successively, and a second deposition cycle n, in which Al source gas flowing, N2 purging, O3 oxidation gas flowing and N2 purging progress successively, the number of times desired for each cycle. At this time, the first HfxAlyOz thin film 2a is deposited such that the number of times of the first cycle is smaller than that of the second cycle (that is, m<n) and so a larger composition ratio of Al than that of Hf, preferably a ratio of Hf:Al of 1:2 is provided within the first HfxAlyOz thin film 2a, and the second HfxAlyOz thin film 2b is deposited such that the number of times of the first cycle is larger than that of the second cycle (that is, m>n) and so a larger composition ratio of Hf than that of Al, preferably a ratio of Hf:Al of 2:1 is provided within the second HfxAlyOz thin film 2b.

After the deposition of the second HfxAlyOz thin film 2b, heat treatment under an oxygen atmosphere, for example, O3 or O2 plasma treatment is also performed in order to improve a leakage current characteristic of the second HfxAlyOz thin film 2b.

In the so-formed capacitor of the present invention, the first HfxAlyOz thin film 2a having a large composition of Al excellently functions as a barrier against electron migration from the storage electrode 1 to the dielectric film 2 because it has a high band gap, thereby making it possible to greatly lower a leakage current. Since the second HfxAlyOz thin film 2b has a large composition of Hf, it can increase the overall charging capacity of the capacitor by virtue of the large dielectric constant of Hf, but its leakage current characteristic is deteriorated due to a low band gap according to the large composition of Hf. However, since impurities, such as C or H, within the second HfxAlyOz thin film 2b are removed by the subsequent O3 or O2 plasma treatment, the leakage current characteristic of the second HfxAlyOz thin film 2b can be also improved in the long run.

Referring to FIG. 4, on one hand, it can be seen that the lower HfxAlyOz thin film having a large composition of Al (Hf:Al=1:2) has a high band gap and so an excellent leakage current characteristic. On the other hand, it can seen that the upper HfxAlyOz thin film having a large composition of Hf has a low band gap and so a somewhat poor leakage current characteristic, but such a poor leakage current characteristic is improved by the subsequent heat treatment such O3 or O2 plasma treatment.

In particular, since the first HfxAlyOz thin film 2a adjoining the storage electrode is not subjected to the heat treatment under an oxidation atmosphere and only the second HfxAlyOz thin film 2b having a poor leakage current characteristic is subjected to the heat treatment, there does not occur a phenomenon where an oxidation reaction is generated at an interface between the dielectric film 2 and the storage electrode 1 to deteriorate the overall electrical characteristics of the dielectric film 2.

In conclusion, the method for forming a capacitor of a semiconductor device according to the present invention can provide an HfxAlyOz capacitor, which is excellent in terms of charging capacity and a leakage current characteristic, by depositing a lower HfxAlyOz thin film having a large composition of Al and an upper HfxAlyOz thin film having a large composition of Hf to form a dielectric film in a compositionally graded HfxAlyOz structure and heat-treating the upper HfxAlyOz thin film under an oxygen atmosphere after its deposition to improve the leakage current characteristic of the upper HfxAlyOz thin film.

As described above, according to the present invention, the dielectric film consists of compositionally graded HfxAlyOz thin films having different compositions of Hf and Al and only the upper HfxAlyOz thin film is subjected to heat treatment under an oxygen atmosphere for improving its leakage current characteristic, so that an HfxAlyOz capacity which is excellent in both dielectric and leakage current characteristics can be formed.

Accordingly, the present invention ensures both charging capacity required and an excellent leakage current characteristic, thereby making it possible to realize highly integrated nm-grade devices.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of semiconductor device, the method comprising the steps of:
    forming a storage electrode;
    depositing HfxAlyOz thin films on the storage electrode to form an HfxAlyQz dielectric film; and
    forming a plate electrode on the HfxAlyOz dielectric film,
    wherein the HfxAlyOz dielectric film consists of compositionally graded HfxAlyOz thin films which are different in compositions of Hf and Al such that the lower HfxAlyOz thin film adjoining the storage electrode has a larger composition ratio of Al than that of Hf and the upper HfxAlyOz thin film has a larger composition ratio of Hf than that of Al. and the upper HfxAlyOz thin film is subjected to heat treatment under an oxygen atmosphere after its deposition.

2. The method as claimed in claim 1, wherein the HfxAlyOz dielectric film consists of a first HfxAlyOz thin film and a second HfxAlyOz thin film deposited on the first HfxAlyOz thin film, and the first and second HfxAlyOz thin films are different in compositions of Hf and Al from each other.

3. The method as claimed in claim 2, wherein a ratio of Hf:Al in the first HfxAlyOz thin film is 1:2 and a ratio of Hf:Al in the second HfxAlyOz thin film is 2:1.

4. The method as claimed in claim 1, wherein the heat treatment under an oxygen atmosphere is performed using O3 or O2 plasma treatment.

5. A method for forming a capacitor of a semiconductor device, the method comprising the steps of:
    forming a storage electrode on a semiconductor substrate;
    depositing a first HfxAlyOz thin film, which has a larger composition ratio of Al than that of Hf, and a second HfxAlyOz thin film, which has a larger composition ratio of Hf than that of Al, on the storage electrode to form a dielectric film having a dual HfxAlyOz structure;
    performing heat treatment of the second HfxAlyOz thin film under an oxygen atmosphere so as to improve a leakage current characteristic of the second HfxAlyOz thin film; and
    forming a plate electrode on the dielectric film having a dual HfxAlyOz structure, which includes the second HfxAlyOz thin film subjected to heat treatment under an oxygen atmosphere.

6. The method as claimed in claim 5, wherein the storage electrode consists of doped polysilicon or TIN.

7. The method as claimed in claim 1, wherein the dielectric film having a dual HfxAlyOz structure is formed by repeatedly performing a first deposition cycle, in which Hf source gas flowing. N2 purging, O3 oxidation gas flowing and N2 purging progress successively, and a second deposition cycle, in which Al source gas flowing, N2 purging, O3 oxidation gas flowing and N2 purging progress successively, the number of times desired for each cycle to deposit a first HfxAlyOz thin film and a second HfxAlyOz thin film having different compositions of Hf and Al, provided that the number of times of the first cycle is smaller than that of the second cycle during the deposition of the first HfxAlyOz thin film so as to provide a larger composition ratio of Al than that of Hf, preferably a ratio of Hf:Al of 1:2 within the first HfxAlyOz thin film, and the number of times of the first cycle is larger than that of the second cycle during the deposition of the second HfxAlyOz thin film so as to provide a larger composition ratio of Hf than that of Al, preferably a ratio of Hf:Al of 2:1 within the second HfxAlyOz thin film.

8. The method as claimed in claim 5 or 7, wherein a ratio of Hf:Al in the first HfxAlyOz thin film is 1:2 and a ratio of Hf:Al in the second HfxAlyOz thin film is 2:1.

9. The method as claimed in claim 5, wherein the heat treatment under an oxygen atmosphere is performed using O3 or O2 plasma treatment.

10. The method as claimed in claim 5, wherein the plate electrode consists of doped polysilicon or TiN.

* * * * *